United States Patent
Bohnen et al.

(10) Patent No.: US 8,199,525 B2
(45) Date of Patent: Jun. 12, 2012

(54) TRANSPORT HOUSING FOR AN ELECTRONIC FLAT MODULE

(75) Inventors: Peter Bohnen, Berlin (DE); Philip Mihailovic, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 539 days.

(21) Appl. No.: 12/310,691

(22) PCT Filed: Aug. 23, 2007

(86) PCT No.: PCT/EP2007/058766
§ 371 (c)(1),
(2), (4) Date: Mar. 3, 2009

(87) PCT Pub. No.: WO2008/028820
PCT Pub. Date: Mar. 13, 2008

(65) Prior Publication Data
US 2009/0273906 A1  Nov. 5, 2009

(30) Foreign Application Priority Data
Sep. 6, 2006  (DE) .......................... 10 2006 042 417

(51) Int. Cl.
*H05K 7/00*  (2006.01)

(52) U.S. Cl. ......... 361/801; 361/732; 361/747; 361/827

(58) Field of Classification Search .................... 361/801
See application file for complete search history.

(56) References Cited

U.S. PATENT DOCUMENTS

| | | | |
|---|---|---|---|
| 4,703,137 A * | 10/1987 | Bohnen et al. | 200/50.25 |
| 4,840,286 A | 6/1989 | Heberling | |
| 4,858,764 A | 8/1989 | Domokos | |
| 5,285,895 A | 2/1994 | Bolt | |
| 6,121,548 A * | 9/2000 | Matsuoka | 174/59 |
| 6,545,217 B2 * | 4/2003 | Sato | 174/50 |
| 6,705,574 B2 * | 3/2004 | Nakagawa et al. | 248/49 |
| 6,738,474 B1 * | 5/2004 | Miller | 379/413.03 |
| 7,652,888 B2 * | 1/2010 | Bohlinger et al. | 361/732 |
| 2004/0080923 A1 * | 4/2004 | Janisch | 361/826 |
| 2006/0029332 A1 * | 2/2006 | Chiu et al. | 385/53 |
| 2007/0140626 A1 * | 6/2007 | Chan | 385/89 |

FOREIGN PATENT DOCUMENTS

| | | |
|---|---|---|
| DE | 262407 A1 | 5/1911 |
| DE | 263736 A1 | 3/1912 |
| DE | 8532243 U1 | 1/1986 |
| DE | 8700830 U1 | 3/1987 |
| DE | 4303784 A1 | 8/1993 |
| DE | 29810499 U1 | 10/1998 |
| DE | 19919188 A1 | 11/2000 |
| DE | 20208019 U1 | 11/2002 |
| DE | 19581789 B4 | 11/2005 |

* cited by examiner

*Primary Examiner* — Anthony Q Edwards

(57) ABSTRACT

A transport housing for receiving an electronic flat assembly, the electronic assembly having at least one controllable electronic component in the form of a DIP switch and a connecting line, has two housing halves receiving the flat assembly, wherein the one housing half is inserted at least partially into the other housing half, and wherein the two housing halves have a plurality of molded elements that are disposed in a staggered arrangement, for creating a molded lock having two detent positions successively disposed in the locking direction.

18 Claims, 4 Drawing Sheets

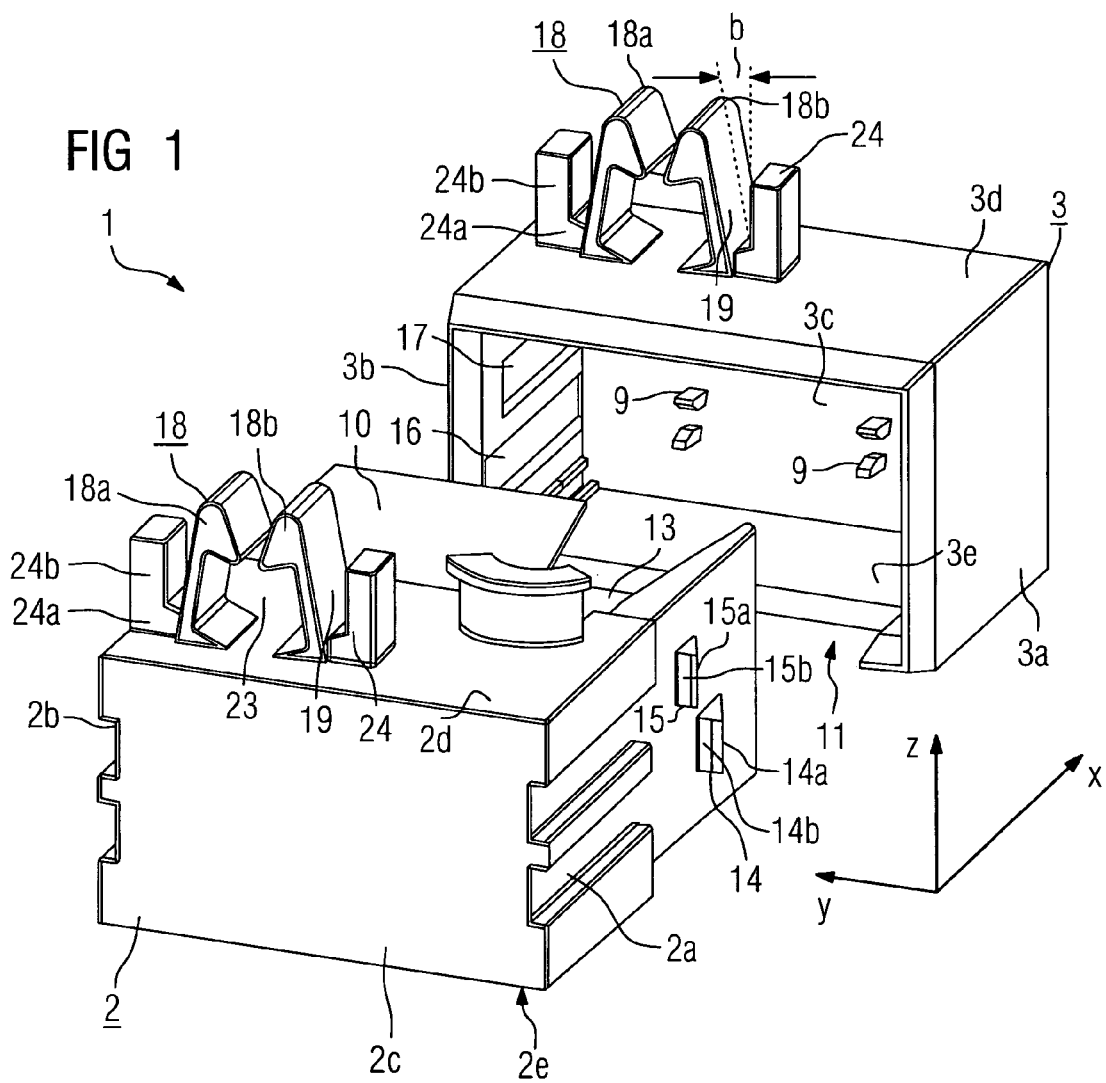

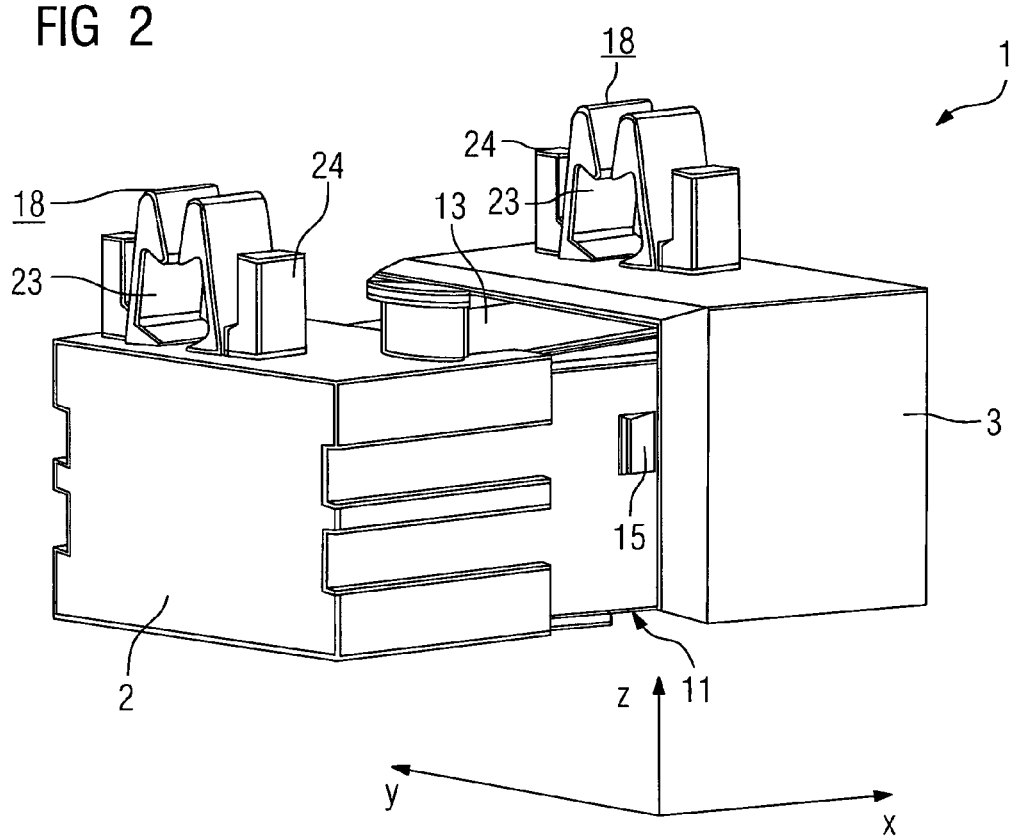
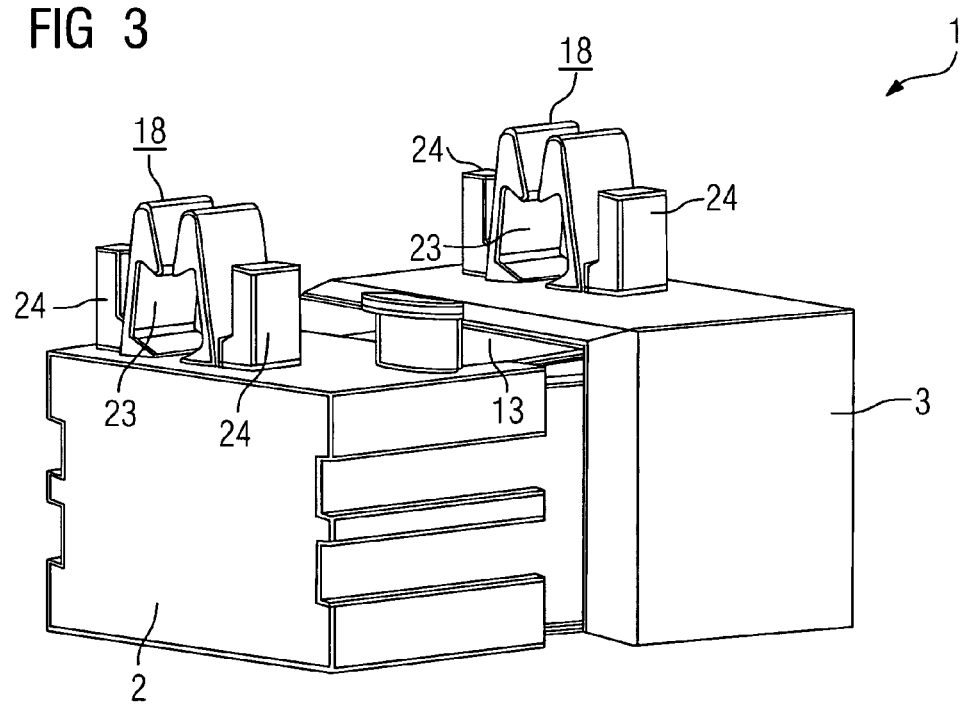

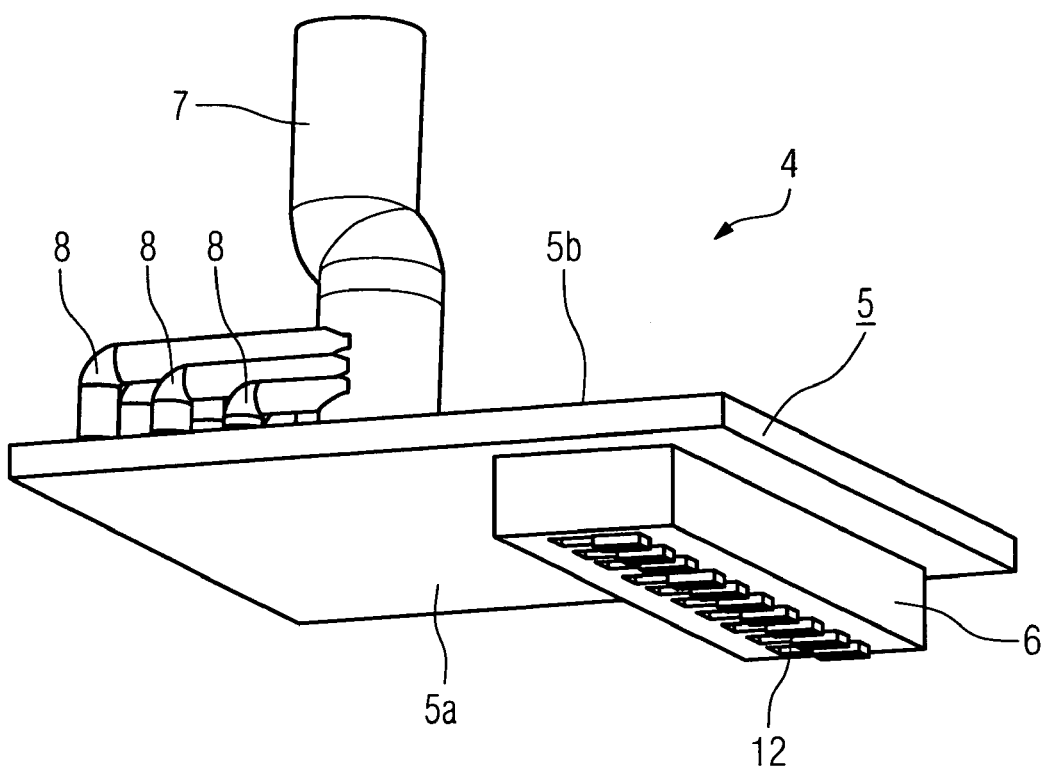

TRANSPORT HOUSING FOR AN ELECTRONIC FLAT MODULE

CROSS REFERENCE TO RELATED APPLICATIONS

This application is the US National Stage of International Application No. PCT/EP2007/058766 filed Aug. 23, 2007 and claims the benefit thereof. The International Application claims the benefits of German Patent application No. 10 2006 042 417.4 DE filed Sep. 6, 2006, both of the applications are incorporated by reference herein in their entirety.

FIELD OF INVENTION

The invention relates to a transport housing for receiving an electronic flat module.

SUMMARY OF INVENTION

An electronic flat module of said kind is an integration system of discrete electronic components on a printed wiring board, said system also being referred to as a system-in-package (SiP). An operator-accessible or settable electronic component in the form or in the manner of a dual inline package (DIP) switch or coding switch, implemented for example in surface-mount device (SMD) technology, is often mounted on said board. Moreover the flat module is frequently already provided with a connecting lead before its final assembly or its final installation.

If the flat module includes a sensitive component (ESDS) as defined in DIN EN 61340-5-1, i.e. a discrete component, an integrated circuit (IC) or a component assembly which can be damaged mechanically, by electrostatic fields and/or by electrostatic discharge during routine handling, testing and transport, a maximally reliable protection of the affected ESD-sensitive component or of the entire flat module is desirable, in particular also for transportation purposes.

An object of the invention is therefore to disclose a transport housing or protective enclosure that is suitable in particular for a flat module of the aforesaid kind.

This object is achieved according to a transport housing as claimed in the independent claim. Toward that end the transport housing has two housing halves for receiving the flat module, wherein one housing half can be inserted at least partially into the other housing half. The housing halves can be joined to each other in at least two closing positions by means of molded elements. For that purpose the two housing halves have a number of molded elements disposed in a staggered arrangement in order to produce a molded lock having two latching positions disposed one behind the other in the locking direction.

Advantageous embodiments, developments and variants are the subject matter of the dependent claims.

The transport housing serving as a protective enclosure is suitable in particular for the mechanical and/or electronic or, as the case may be, electrostatic protection of a flat module in the form of, for example, a printed wiring board which is provided both with a DIP switch for individual device coding and with a connecting lead. The two housing halves of the transport housing receive the flat module and are beneficially closed by one half being inserted into the other.

In this case the two housing halves are embodied in such a way that an at least two-step locking of the housing is made possible. In a first locking position the transport housing is still not locked completely, with an operating window being left exposed, in particular to enable the DIP switch to be actuated. In said first locking position the DIP switch or a similar coding element can be operated from outside in order to establish certain application-specific conductor track connections or links on the printed wiring board of the flat module via corresponding switching elements.

The provision of the operating window is beneficially achieved in that at least one of the housing halves has an operating opening which is embodied for example in the form of a U-shaped housing cutout provided on one side of the housing. The open side face of said U-shaped housing cutout is then formed by means of a corresponding housing edge of the other housing half in the first locking position.

The transport housing can then be closed completely by moving the two housing halves into a second locking position. In the second locking position the transport housing is preferably locked, with a pass-through opening being left free to allow the connecting lead of the flat module to be brought out. In this case the locking mechanism is preferably embodied in such a way that the two housing halves can no longer be separated from each other or can be separated only by means of a special tool for opening the transport housing.

The locking mechanism of the transport housing is advantageously formed by means of the molded elements provided on the two housing halves and disposed there in a staggered arrangement in order to produce the multistep molded lock. In this case two latching positions disposed one behind the other in the locking direction are beneficially provided for the two different locking positions of the transport housing.

In an advantageous embodiment the molded elements are formed by means of latching hooks molded onto the housing halves and latching recesses corresponding thereto. In this case the latching hooks are preferably provided on the housing half which is closable by being inserted into the other housing half. Accordingly the latching recesses are then provided on the housing half into which the other housing half can be inserted.

The molded elements formed by means of the latching hooks are disposed in a staggered arrangement with respect to one another in the locking or displacement direction. In this case the latching hooks can molded onto different housing sides of the corresponding housing half. Preferably, however, the latching hooks are provided in each case in pairs in a staggered configuration on opposite sides of the housing. The latching hooks are therein disposed in the transverse direction to the locking or displacement direction adjacent to or above one another in an offset arrangement.

Analogously, the molded elements forming the latching recesses are in turn provided preferably in pairs on opposite side surfaces of the corresponding housing half and disposed there in turn adjacent to or above one another in the transverse direction to the locking direction.

The first effective latching recess in the locking direction is in this case embodied in such a way that the front latching hook corresponding thereto in the locking or displacement direction is displaceable along said latching recess until the subsequent second latching hook snaps into place in the corresponding second latching recess.

To ensure reliable sliding guidance as well as a secure engagement of the two housing halves with each other, each latching hook is provided with a leading bevel or ramp running in the locking direction and opening into a latching edge or a latching stop for embodying a rear engagement with a corresponding stop or latching surface of the corresponding latching recess.

The locking mechanism provided by the staggered arrangement of the molded elements allows an incomplete first locking position in which the two housing halves are latched together by means of the front molded elements in the locking direction in a first snap-fit or latching position. In addition the locking mechanism allows a complete second locking position. In the latter position, the two housing halves are joined together by way of the rear molded elements in the locking direction in the second latching position, thereby forming a molded or latching lock which cannot be released or can be released only with the aid of a special tool.

In said complete locking position a pass-through opening provided in one of the housing halves for bringing out the connecting lead of the flat module is unclosed. In said complete locking position the inside of the housing rear wall of one housing half forms a stop for an insertion section or shaft provided on the other housing half, via which the corresponding housing half can be introduced into the other housing half.

In an advantageous development, at least one of the two housing halves has a snap-fit element provided on and preferably molded onto the outside of the housing and forming an insertion eye for a clamp-type fastener. By means of said snap-fit element the transport housing can be fixed in a snap-fit or clamp-type manner to a sub-line of a higher-order connecting cable which also includes the connecting lead of the flat module.

According to a particularly beneficial variant, a stop element is disposed in the bending direction downstream of the spring-flexible or flexurally resilient snap-fit element, which stop element limits the bending stroke of the snap-fit element or its snap-fit or latching hooks. In a snap-fit element formed by means of two latching hooks a stop element of said type is beneficially assigned in each case to each of the latching hooks on the rear of the hook facing away from the insertion eye. Like the snap-fit element itself, said stop element is preferably molded as a single piece onto an outside face of the respective housing half. The stop element thus serving as a stroke limiter prevents excessive bending and hence damage to or breaking-off of the corresponding latching hook or snap-fit element.

The advantages achieved by means of the invention include in particular that by means of a staggered latching arrangement of a transport housing constructed from two mutually locking housing halves a complete mechanical and electronic or electrostatic protection of a flat module in accordance with the standard cited in the introduction is ensured.

Furthermore, the two-part transport housing allows the possibility of performing settings on the flat module even after it has been installed into a higher-order device. The transport housing can then be irreversibly closed completely and without the need for a special tool, thereby reliably preventing undesirable tampering with the setting of, for example, the DIP switch.

By means of the additional snap-fit elements with stroke limiter the transport housing or protective enclosure forming a complete assembly can be fixed easily, without the aid of tools, and in a time-saving manner to device wiring or cabling in the form of, for example, a cable harness.

The two-part or multipart housing is not only suitable for transporting flat modules of the aforesaid type, in particular having connecting leads, ESD-sensitive components and/or DIP switches. Rather, said housing constructed from two housing halves which can be latched together, preferably in staggered holding or fixing positions, is suitable generally as an outer packaging or protective enclosure for populated printed wiring boards and other device parts or components.

Attaching or molding-on a stop element in the bending direction downstream of a snap-fit element or latching hook in order to limit the bending stroke independently of its intended use on a two-part enclosure or transport housing of said kind is also already advantageous in itself if damage to or breaking-off of such a snap-fit element or latching hook is to be prevented as reliably as possible, in particular in the case of frequent stress or in harsh environments.

BRIEF DESCRIPTION OF THE DRAWINGS

An exemplary embodiment of the invention will be explained in more detail below with reference to a drawing, in which:

FIG. 1 shows a perspective view of a transport housing having two unlocked housing halves, FIG. 2 shows the transport housing according to FIG. 1 in a first locking position, FIG. 3 shows the transport housing according to FIG. 1 in a second locking position, FIG. 4 shows a perspective view of a flat module having a DIP switch and a connecting lead that is to be received by the transport housing.

DETAILED DESCRIPTION OF INVENTION

Figure 5:
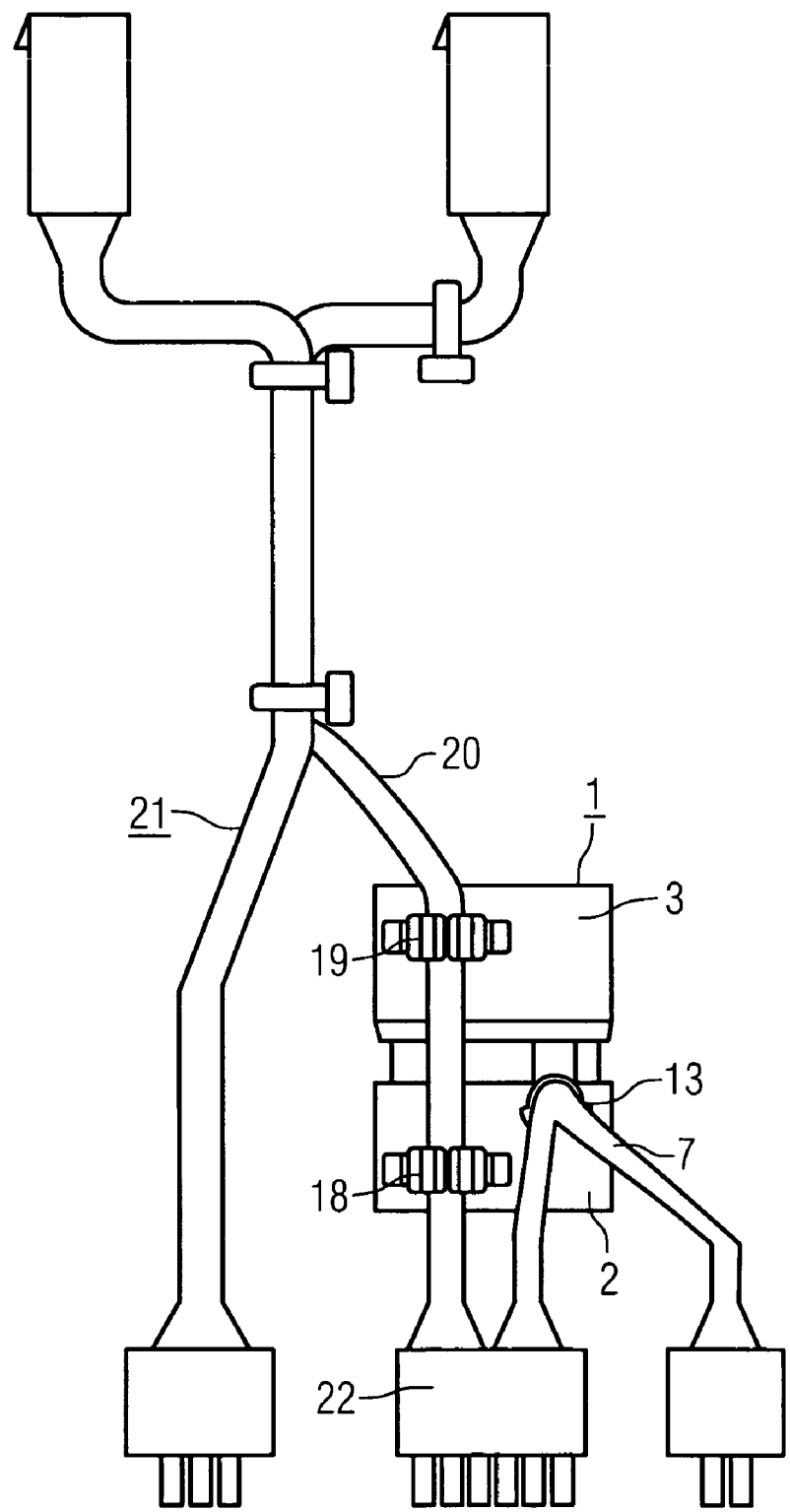
FIG. 5 shows the transport housing fixed by a clamp-type fastening to a cable harness and having a brought-out connecting lead.

Corresponding parts are labeled with the same reference signs in all the figures.

FIGS. 1 to 3 shows a transport housing or protective enclosure 1 having two housing halves 2,3 preferably made of plastic. Referred to the coordinate system shown, said halves can be locked together in the locking or displacement direction running in the x-direction by inserting one housing half 2 into the other housing half 3.

The transport housing 1 shown serves to accommodate a flat module 4 shown in FIG. 4. The flat module 4 comprises a printed wiring board 5 and a DIP switch 6 as well as a connecting lead or connecting cable 7. In the schematic according to FIG. 4 the DIP switch 6 is mounted on the underside 5a of the printed wiring board 5 using SMD technology, for example. The connecting lead 7 is electrically contacted by means of its conductor wires 8 on the opposite topside 5a in a manner not shown in further detail to conductor tracks of the printed wiring board 5. The flat module 4 can initially be inserted into the first housing half 2 which is then subsequently locked with the second housing half 3.

The first housing half 2 of the transport housing 1 comprises two housing narrow sides 2a,2b disposed opposite each other and a housing rear side 2c, also referred to in the following as a housing rear wall, as well as a housing topside 2d and a housing underside 2e. Similarly, the second housing half 3 has two housing narrow sides 3a,3b disposed opposite each other and a housing rear side 3c, also referred to in the following as a housing rear wall, as well as a housing topside 3d and a housing underside 3e.

On the inside of the housing, molded onto the housing rear wall 3d of the housing half 3 are positioning or retaining studs 9 for fixing the flat module 4 in position. Similarly, locating or positioning studs (not visible) are molded on the inside of the housing onto the housing rear wall 2c of the first housing half 2. By means of said positioning studs 9 disposed in pairs opposite one another, the flat module 4 is secured and its position fixed inside the transport housing 1 by way of a three- or four-point mounting. For that purpose the flat module 4 is first introduced for example into the first housing half 2 which is then locked by means of the second housing half 3 while the flat module 4 is introduced between the positioning studs 9.

The transport housing 1 is locked by inserting the two housing halves 2,3 one inside the other. For that purpose the housing half 2 has an insertion or introduction section 10 whose outer circumferential dimension is matched to the inner circumferential dimension of the housing half 3.

The two housing halves 2,3 are locked in two succeeding locking positions in the locking or insertion direction X. In this case, in the first locking position indicated in FIG. 2, the transport housing 1 is still not locked completely. In this first locking position an operating opening 11 provided in the second housing half 3 on its housing underside 3e remains open in the manner of an operating window. The DIP switch 6 of the flat module 4 can be accessed via said operating window 11 that is not yet closed in the first locking position according to FIG. 2. This enables the DIP switch 6 to be set for individual device coding via its slide keys or setting elements 12 in order, for example, to produce defined connections or links between conductor tracks of the printed wiring board 5.

Subsequent to a completed operation or actuation of the DIP switch 6, the transport housing 1 is completely closed by moving the two housing halves 2,3 into the second locking position shown in FIG. 3.

As can be seen from FIGS. 3 and 5, even in this second locking position of the two housing halves 2,3, a pass-through opening 13 provided on the housing topside 2d of the housing half 2 remains unclosed in order to allow the connecting lead or connecting cable 7 of the flat module 4 to be brought out.

In order to produce the two locking positions of the transport housing 1, molded elements corresponding to one another are provided on the two housing halves 2,3 for the purpose of establishing a molded or latching lock. For that purpose two latching hooks 14,15 are provided on the mutually opposing narrow sides 2a,2b of the housing half 2 in the region of its insertion section 10. Like the non-visible latching hooks on the opposite housing narrow side 2b, the two latching hooks 14,15 are disposed one behind the other in a staggered configuration in the locking or displacement direction X and at the same time are arranged offset with respect to each other in the X-direction as well as in the transverse direction Z running at right angles hereto. The latching hooks 14,15 are molded on the outside onto the housing narrow sides 2a of the housing half 2 and each have a insertion or leading bevel 14a,15a and a latching edge 14b and 15b respectively. By means of said latching edge 14b,15b the latching hooks 14,15 engage at the rear with corresponding latching recesses 16 and 17 which in each case are provided on the inside or inside wall on the same housing narrow side 3a,3b of the housing half 3. The latching recesses 16,17 likewise extend in the displacement direction X.

In the first locking direction of the transport housing 1 shown in FIG. 2, the front (lower) latching hooks 14 in the locking direction X are engaged in the corresponding latching recess 16 in each case. In said first locking or latching position, in which the operating window 11 is still open to allow individual coding of the DIP switch 6, the rear latching hooks 15 in the locking direction X are not yet engaged with their corresponding latching recesses 17.

Said molded elements 15,17 are also latched into place in order to establish the second latching position and hence the second locking position (FIG. 3). In said position of the two housing halves 2,3 relative to each other, in which the transport housing 1 is completely closed except for the pass-through opening 13 being left exposed for the purpose of bringing out the connecting lead 7 of the flat module 4, the operating window 11 is also closed. In said completely closed locking position, in which the molded elements 15, 17 are locked together, the housing rear wall 3c serves as an insertion stop for the housing half 2 inserted into the housing half 3 via the insertion section 10.

Each housing half 2,3 has a snap-fit element 18. The snap-fit elements 18 serve for fixing the transport housing 1 in a clamp-type manner to a higher-order connecting cable 20 of a cable harness or a distribution network 21. Also assigned to the latter via a plug-in contact or a contact housing 22 is the connecting lead 7 of the flat module 4 disposed in the transport housing 1.

The snap-fit elements 18 are in each case formed by means of two mutually opposing latching hooks 18a,18b which delimit an insertion eye 23 for receiving the connecting cable 20. Each snap-fit element 18 or each of the latching hooks 18a,18b is assigned a stop element 24 acting as a stroke limiter. The respective stop element 24 stands up dome-like in the Z-direction from the housing topside 2d,3d of the respective housing half 2 or 3 and is arranged on the hook rear side 19 of the respective snap-fit element 18 or latching hook 18a,18b facing away from the insertion eye 23. Both the snap-fit elements 18 and the stop elements 24 are in turn molded preferably as a single piece onto the respective housing half 2 and 3.

In an advantageous embodiment the stop elements 24 are embodied as L-shaped, with the comparatively short L leg 24a fitting in a practically gap-free manner against the hook rear side 19 of the respective latching hook 18a,18b. In contrast, the comparatively long L leg 24b of the stop element 24 is spaced apart from the corresponding hook rear side 19. The corresponding clearance therefore defines the bending stroke b possible for the corresponding latching hook 18a, 18b and hence for the respective snap-fit element 18 in the bending direction Y, which bending stroke b is dimensioned or rated accordingly with regard to a destruction-proof bending stress of the respective latching hook 18a,18b.

The invention claimed is:

1. A transport housing for receiving an electronic flat module, comprising:
   a first housing half and a second housing half, the two housing halves receiving an electronic flat module, wherein one housing half is inserted at least partially into the other housing half;
   a plurality of molded elements arranged on the first and second housing halves for the purpose of the housing halves being joined in at least two locking positions,
   wherein the molded elements are arranged in a staggered configuration in order to produce a molded lock having two latching positions disposed one behind the other in the locking direction,
   wherein the electronic flat module has an operator-accessible electronic component in the form of a Dual-in-Package (DIP) switch and a connecting lead,
   wherein one of the two housing halves has a closable operating opening, and
   wherein the closable operating opening is for actuating the DIP switch mounted on the flat module.

2. The transport housing as claimed in claim 1, wherein one of the housing halves has an unclosable pass-through opening.

3. The transport housing as claimed in claim 2, wherein the unclosable pass-through opening is for bringing out the connecting lead of the flat module.

4. The transport housing as claimed in claim 1, wherein the molded elements are molded onto the same housing side in each case in an offset configuration with respect to one another in the transverse direction relative to the displacement direction.

5. The transport housing as claimed in claim 1, wherein a first and a second latching hook is provided on one of the two housing halves and disposed one behind the other in the locking direction as well as a first and a second latching recess corresponding thereto on the other housing half.

6. The transport housing as claimed in claim 5, wherein the first latching recess in the locking direction is embodied such that the corresponding first latching hook is displaceably guided along the first latching recess until the subsequent second latching hook snaps into place in the corresponding second latching recess.

7. The transport housing as claimed in claim 6, wherein the latching hooks have a leading bevel extending in the locking direction and a latching stop disposed opposite thereto for forming a rear engagement with the corresponding latching recesses.

8. The transport housing as claimed in claim 1, wherein one of the housing halves has an insertion section introduced into the other housing half, wherein the housing rear wall of the other housing half is effective as an insertion stop in the second latching position.

9. A transport housing for receiving an electronic flat module, comprising:
a first housing half and a second housing half, the two housing halves receiving an electronic flat module, wherein one housing half is inserted at least partially into the other housing half;
a plurality of molded elements arranged on the first and second housing halves for the purpose of the housing halves being joined in at least two locking positions,
wherein the molded elements are arranged in a staggered configuration in order to produce a molded lock having two latching positions disposed one behind the other in the locking direction,
wherein a first and a second latching hook is provided on one of the two housing halves and disposed one behind the other in the locking direction as well as a first and a second latching recess corresponding thereto on the other housing half, and
wherein the latching hooks have a leading bevel extending in the locking direction and a latching stop disposed opposite thereto for forming a rear engagement with the corresponding latching recesses.

10. The transport housing as claimed in claim 9, wherein the electronic flat module has an operator-accessible electronic component in the form of a Dual-in-Package (DIP) switch and a connecting lead.

11. The transport housing as claimed in claim 10, wherein the first or the second housing half has a snap-fit element which is spring-flexible or flexurally resilient in a bending direction and has an insertion eye for a clamp-type fixing to a connecting cable connected to the connecting lead of the flat module.

12. The transport housing as claimed in claim 11, wherein a stop element disposed downstream of the snap-fit element in the bending direction for the purpose of limiting the bending stroke of the snap-fit element.

13. The transport housing as claimed in claim 11, wherein the snap-fit element is formed by means of two latching hooks disposed opposite each other and delimiting the insertion eye.

14. The transport housing as claimed in claim 13, wherein each latching hook of the snap-fit element is in each case assigned a stop element on the hook rear side facing away from the insertion eye.

15. The transport housing as claimed in claim 11, wherein the snap-fit element and the stop element are molded onto the respective housing half.

16. The transport housing as claimed in claim 9, wherein one of the two housing halves has a closable operating opening.

17. The transport housing as claimed in claim 9, wherein one of the housing halves has an unclosable pass-through opening.

18. A transport housing for receiving an electronic flat module, comprising:
a first housing half and a second housing half, the two housing halves receiving an electronic flat module, wherein one housing half is inserted at least partially into the other housing half;
a plurality of molded elements arranged on the first and second housing halves for the purpose of the housing halves being joined in at least two locking positions,
wherein the molded elements are arranged in a staggered configuration in order to produce a molded lock having two latching positions disposed one behind the other in the locking direction, and
wherein the second housing half
in a first latching position the does not completely lock the first housing half, while leaving free an operating opening to allow actuation of a DIP switch mounted on the flat module, and
in a second latching position completely locks the first housing half, while bringing out a connecting lead of the electronic flat module.

* * * * *